United States Patent
Li et al.

(10) Patent No.: US 6,212,490 B1
(45) Date of Patent: *Apr. 3, 2001

(54) HYBRID CIRCUIT MODEL SIMULATOR FOR ACCURATE TIMING AND NOISE ANALYSIS

(75) Inventors: Ken-Ming Li, Santa Clara; Chi-Jung Huang, Saratoga, both of CA (US)

(73) Assignee: S3 Incorporated, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/104,049

(22) Filed: Jun. 24, 1998

(51) Int. Cl.$^7$ .................................................... G06F 17/50
(52) U.S. Cl. ................................. 703/14; 703/19; 716/6
(58) Field of Search ........................ 395/500.02, 500.09, 395/500.07, 500.35, 500.4

(56) References Cited

U.S. PATENT DOCUMENTS

| | | | |
|---|---|---|---|
| 4,792,913 | * 12/1988 | Buckland et al. | 395/500.24 |
| 5,369,604 | * 11/1994 | Ravindranath et al. | 395/500.05 |
| 5,404,319 | * 4/1995 | Smith et al. | 395/500.19 |
| 5,559,997 | * 9/1996 | Tsuchida et al. | 395/500.34 |
| 5,568,395 | * 10/1996 | Huang | 395/500.23 |
| 5,682,336 | * 10/1997 | Chian et al. | 395/500.24 |

OTHER PUBLICATIONS

Sandage, R.W. et al., "A Novel Tool for Circuit–System Modeling," IEEE 39th Midwest Symp. on Circuits and Systems, vol. 1, Aug. 1996, pp. 373–376.*

Getreu, I.E., "Behavioral Modeling of Analog Blocks using SABER Simulator," Proc. of the 32nd Midwest Symp. on Circuits and Systems, vol. 2, Aug. 1989, pp. 977–980.*

Chian, M.C. et al., "Automated CAE Tools for Full Custom Design of Bipolar Analog ASICs," 3rd Annual IEEE Proc. of ASIC Seminar and Exhibit, Sep. 1990, pp. P11–4.1–P11–4.7.*

Casinovi, G. et al., "A Multi–Level Simulator with Analog Behavioral Models," IEEE Int'l Symp. on Circuits and Systems (ISCAS '96), vol. 4, May 1996, pp. 699–702.*

(List continued on next page.)

*Primary Examiner*—Kevin J. Teska
*Assistant Examiner*—Kyle J. Choi
(74) *Attorney, Agent, or Firm*—Fenwick & West LLP

(57) ABSTRACT

A system and method for analyzing timing and noise effects in a hybrid circuit which contains a plurality of electrical components. The timing and noise effects for the hybrid circuit are generated by simulating electrical conditions within a hybrid circuit model. The hybrid circuit model is constructed by creating and integrating analog and behavioral models from the plurality of electrical components. The timing and noise effects remain accurate even at high printed circuit board/multi-chip module clock speeds, thereby ensuring that a user is able to construct an optimal design for any one of the plurality of electrical components.

17 Claims, 5 Drawing Sheets

Microfiche Appendix Included
(2 Microfiche, 121 Pages)

OTHER PUBLICATIONS

Antao, B.A. et al., "Automatic Analog Model Generation for Behavioral Simulation," Proc. of IEEE 1992 Custom Integrated Circuits Conf., May 1992, pp. 12.2.1–12.2.4.*

Singh, J. et al., "iMACSIM: A Program for Multi–Level Analog Circuit Simulation," IEEE Int'l Conf. on Computer–Aided Design (ICCAD–91), Nov. 1991, pp. 16–19.*

Yuan et al., "Analysis and modelling of power distribution networks and plane structures in multichip models and PCBs," Electromagnetic Compatibility, 1995, Symposium Record, IEEE Int. Symp., Aug. 1995, pp. 447–452.*

Yook et al., "Application of system–level EM modeling to high–speed digital IC packages and PCBs,"Microwave Theory and Techniques, IEEE Trans., v. 45, No. 10, Oct. 1997, pp. 1847–1856.*

Kimura et al., "A unified technique for PCB/MCM design by combining electromagnetic field analysis with circuit simulator," Design, Automation and Test in Europe, Feb. 1998, pp. 951–952.*

Yuan, Frank Y., et al., "Analysis and Modeling of Power Distribution Networks and Plane Structures in Multichip Modules and PCB's," IEEE International Symposium on Electromagnetic Compatibility, Aug. 1995, pp. 447–452.

Yook, Jong–Gwan, et al., "Application of System–Level EM Modeling to High–Speed Digital IC Pakcages and PCB's," IEEE Transactions on Microwave Theory and Techniques, vol. 45, No. 10, Oct. 1997pp. 1847–1856.

Kimura, H., et al., "A Unified Technique for PCB/MCM Design by Combining Electromagnetic Field Analysis with Circuit Simulator," Proceedings, Design, Automation and Test in Europe, Feb. 1998, pp. 951–952.

* cited by examiner

HYBRID CIRCUIT MODEL SIMULATOR FOR ACCURATE TIMING AND NOISE ANALYSIS

MICROFICHE APPENDIX

The microfiche appendix includes two microfiche with a total number of frames

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. of 121.

BACKGROUND OF THE INVENTION

The present invention relates generally to integrated circuit design, and more particularly to a system and method for analyzing analog characteristics of an integrated circuit design.

DESCRIPTION OF BACKGROUND ART

In designing an integrated circuit chip (source chip), the source chip design effectively must interact with a plurality of integrated circuit chips (target chips), which, like the source chip are electrically coupled to a printed circuit board (PCB)/multi-chip module (MCM). Typically, a conventional analog simulation software tool, such as SPICE, is used to attempt to identify an optimal design for the source chip. Prior to initiating the SPICE simulation, however, the logic design (package) and the input/output (I/O) pin configuration (I/O ring) of each integrated circuit chip as well as the PCB/MCM is transformed into at least one analog circuit model. In addition, input stimuli and specific routes (output circuit blocks) between the I/O ring of the source chip and the I/O ring of the target chips must be defined.

Based upon the SPICE simulation results, the performance of the source chip design can be analyzed and alterations to the source chip design can be made. When the source chip design is altered, a new analog circuit model is generated and a new SPICE simulation is executed. The new performance results again are analyzed and a decision must again be made as to whether the source chip design must be further modified. Prior to finalizing the design of the source chip, several iterations of redesigning and resimulating the source chip design may be performed.

Even though conventional SPICE simulations are relatively helpful for optimizing the performance of the source chip with regard to the PCB/MCM and the target chips, SPICE still possesses certain limitations, which preclude the optimal design of a source chip from truly being realized. Utilizing an ideal analog circuit analysis tool, a conventional system would be able to simulate in its entirety a single integrated analog circuit model, which included the source chip, the target chips and the PCB/MCM. Unfortunately, since conventional analog simulation tools, such as SPICE, can only simulate circuits with approximately 10,000 transistors, typical analog circuit models, which contain well above that number of transistors, cannot be analyzed as a whole. Rather, a conventional system must deconstruct the analog circuit model into smaller discrete sub-components, which each are separately simulated. The results of each of these simulations then are interpolate to determine the overall performance characteristics of the combined analog circuit model, which result in the development of the optimal source chip design. Unfortunately, with interpolative techniques having inherent inaccuracies, the optimal source chip design is not usually fully realized.

Another limitation with simulating a combined analog circuit model is that in addition to not being able to simulate all of the components of an analog circuit model together, the user also cannot solely rely upon SPICE simulations for real-time circuit analysis of certain integrated circuits, such as the target chips. For example, since the source chip often is designed at the same time as the target chips, the attempt to construct an optimal source chip design must be accomplished without full information regarding the target chips. Since SPICE simulations require extensive information concerning the design of the integrated circuit chip, an alternative software simulation tool, which relies upon behavioral circuit models, such as Input/Output (I/O) Buffer Information Specification (IBIS), must be used to approximate the final design of the integrated circuit chips, which have not yet been fully designed.

One such conventional software simulation package, which approximates real-time conditions of IBIS behavioral circuit models, is the BoardQuest by Cadence Design System of San Jose, Calif. Such conventional IBIS-based simulators rely upon an electronic look-up table, rather than upon the physical layout design of the chip, to simulate a behavioral circuit model with specific current and voltage I/O behavioral characteristics. Like SPICE, after an IBIS-based simulator constructs the circuit model, specific input stimuli is defined in order for the output results to be generated. Unlike SPICE, however, the IBIS-based simulator does not directly take into consideration the PCB/MCM. Rather, the focus is upon predefined I/O behavioral characteristics of the target chip. Any PCB/MCM effects upon the source chip or the target chips must be approximated by integrating estimate voltage and current I/O behavioral characteristics into the source chip or the target chip behavioral circuit models. Such rough approximations of the interaction of the PCB/MCM with the source chip and target chips further add to the inaccuracy of the output results of the simulation.

Additionally, as the clock speed of the PCB/MCM increases, the IBIS-based simulator is unable to adequately compensate for the source chip and the target chips becoming more sensitive to noise and timing problems. Should the IBIS-based simulations be attempted at PCB/MCM speeds above approximately 100 MHz, IBIS-based simulations will fail to produce satisfactory results that account for such subtle, but influential analog effects as simultaneous switching noise, ground bounce, signal integrity and timing issues. Furthermore, since IBIS-based circuit models and SPICE circuit models are incompatible, the limitations of IBIS-based simulators cannot be circumvented by utilizing SPICE to simulate IBIS-based behavioral models. Without these subtle high speed analog effects included within the software simulation of the behavioral circuit model, the results of these higher clock speed simulations results in merely idealized results, which do not reflect real-time effects on the source chip.

To ensure more accurate simulation results for designing an optimal source chip, what is needed is a system and method for more accurately simulating the behavioral and analog characteristics of the source chip integrated with the PCB/MCM and the target chips including the timing and noise effects which are attributable to high speed PCB/MCM clock speeds.

SUMMARY OF THE INVENTION

Accordingly, the present invention provides a method and system for analyzing the operation of a source chip design in conjunction with the PCB/MCM and the target chips through the construction and simulation of a hybrid circuit model. In this manner, the operation of each component of the circuit model, including the source chip and the associated PCB/MCM and target chips, can be jointly observed, measured, and adjusted during the design process of each component.

In order to accomplish such a simulation, it is useful to extract the essential analog characteristics of the PCB/MCM and the source chip and construct a hybrid circuit model framework. A plurality of target chip behavioral models then are integrated with the hybrid circuit model framework to create the hybrid circuit model. A software simulation tool then accurately measures and analyzes the hybrid circuit model for real-time conditions, which will assist in optimizing the source chip.

Unlike previous attempts at analyzing the combined circuit model, the simulation of the hybrid circuit model account for, even at high PCB/MCM clock speeds, the following electrical characteristics: 1) timing effects, including intra- and inter-component delays for various PCB/MCM components, 2) noise effects, including ground bounce, reflections, crosstalks and other effects that may be generated by the interaction of various PCB/MCM components, and 3) signal integrity and degradation.

With such factors considered by this method, the optimal design for the source chip can more easily be realized. Even without complete information as to the target chips, the present invention still is able to utilize both behavioral and analog models to obtain more accurate electrical characteristics of the combined circuit. Furthermore, as the clock speed of the PCB/MCM increases, the present invention, unlike conventional systems and methods, can accurately obtain performance characteristics which will ensure that the source chip is optimally designed for the PCB/MCM and the target chips.

DETAILED DESCRIPTION OF A PREFERRED EMBODIMENTS

A preferred embodiment of the present invention is now described with reference to the figures where like reference numbers indicate identical or functionally similar devices. Also, in the figures, the left most digits of each reference number correspond to the figure in which the reference number is first used.

A preferred embodiment of the present invention is directed to a method and system for simulating the operation of a source chip design in conjunction with the PCB/MCM and the target chips. In this manner, the operation of each component of the circuit model, including the source chip and the associated PCB/MCM and target chips, can be analyzed and adjusted during the design process of each component. In order to accomplish such a simulation, the essential analog characteristics of the PCB/MCM and the source chip and the behavioral characteristics of the target chip must be integrated into a single hybrid circuit model. A software simulation tool then analyzes the hybrid circuit model for real-time conditions, which reflect the performance level of each component. Unlike conventional systems, the present invention accounts for, even at high PCB/MCM clock speeds 1) the timing effects, including intra- and inter-component delays for various PCB/MCM components, 2) the noise effects, including ground bounce, reflections, crosstalks and other effects that may be generated by the interaction of various PCB/MCM components, and 3) the signal integrity and degradation.

Figure 1:
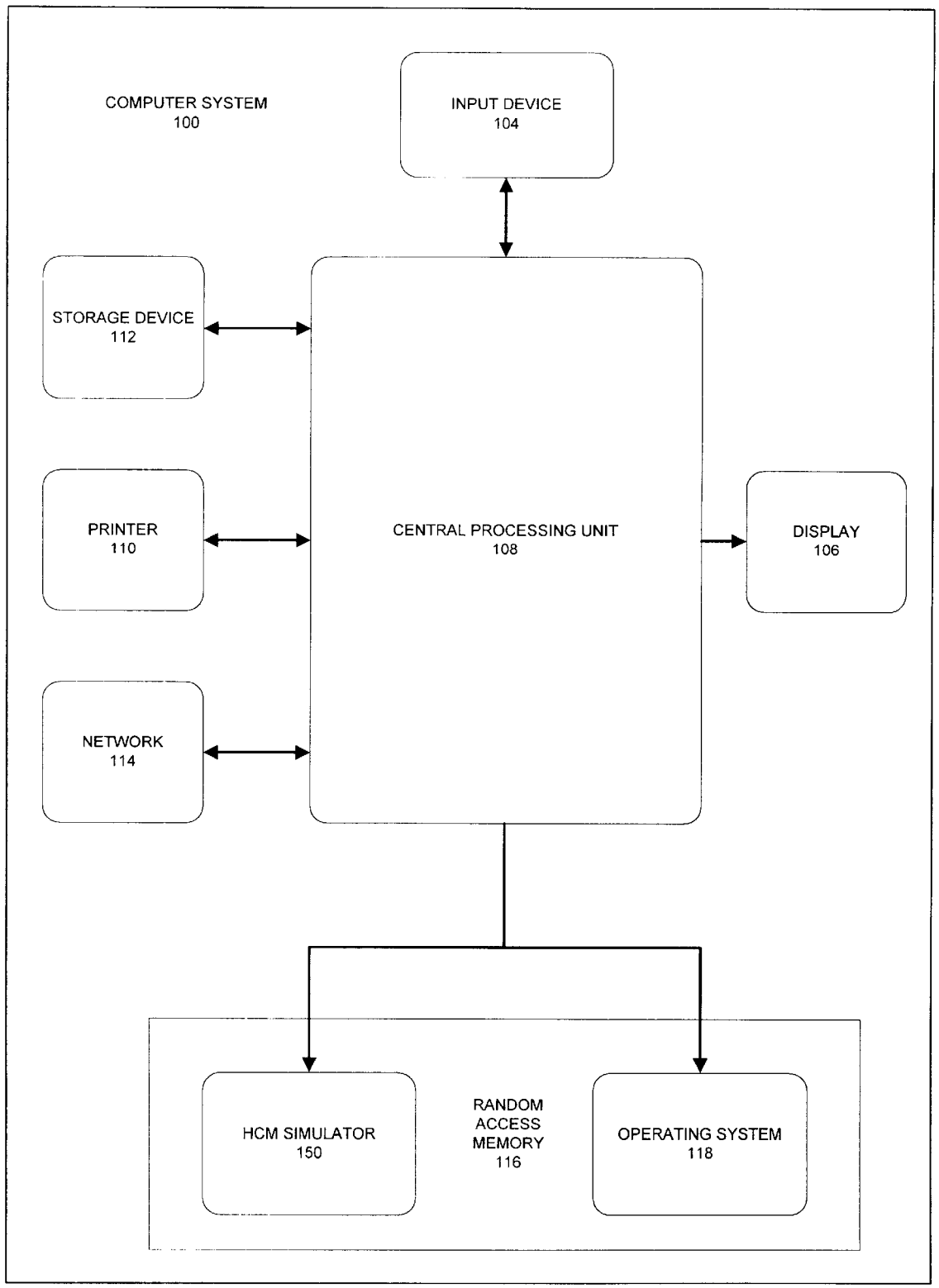
FIG. 1 is an illustration of a computer system in which a preferred embodiment operates.

FIG. 1 is an illustration of a computer system 100 in which a preferred embodiment operates. The system 100 includes an input device 104, a central processing unit (CPU) 108, a display 106, a printer 110, a storage device 112 and a random access memory (RAM) 116. The CPU 108 is coupled to the input device 104, the display monitor 106, the printer 110, the storage device 112 and the RAM 116. During computer operation, the RAM 116 includes an operating system 118, e.g., UNIX, and the hybrid circuit model simulator 150. The input device 104, CPU 108, display 106, printer 110, and mass storage 112 all are part of a conventional computing system, e.g., a Sun Micro Workstation. In alternative embodiments the computer system also is coupled to a network 114.

Figure 2:
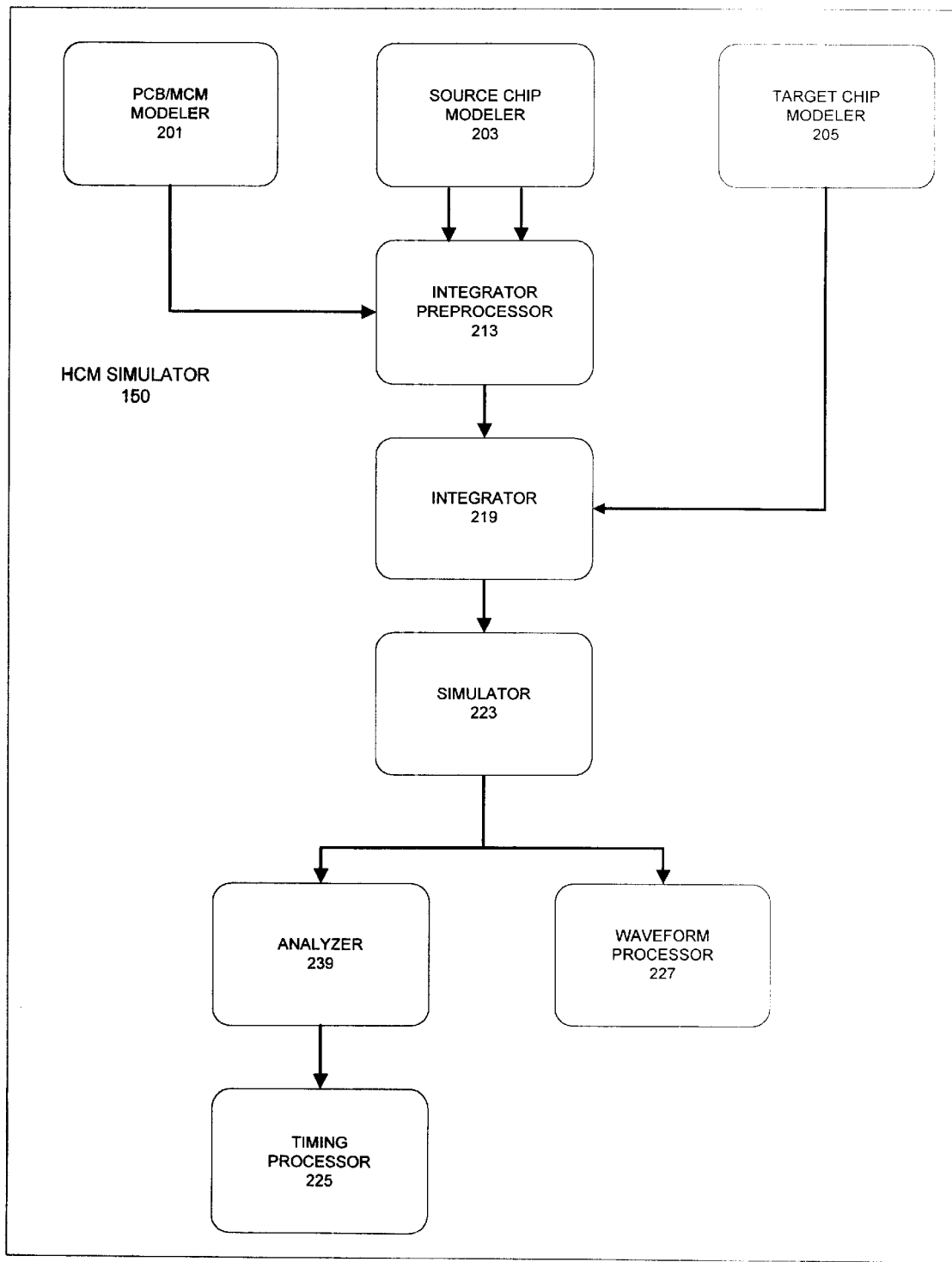
FIG. 2 is an embodiment of the HCM simulator for generating and analyzing a hybrid circuit model in accordance with a preferred embodiment.

FIG. 2 is a more detailed illustration of the hybrid circuit model (HCM) simulator 150 according to a preferred embodiment. The HCM simulator 150 comprises, a PCB/MCM modeler module 201, a source chip modeler module 203, a target chip modeler module 205, an integrator preprocessor module 213, an integrator module 219, a simulator module 223, an analyzer module 239, a timing processor module 225 and a waveform processor module 227. In a preferred embodiment, to initiate the processing and simulating of the circuit information relating to the source chip, the target chip and the PCB/MCM, the user executes a PERL script within UNIX, entitled OBAT, which is attached to the appendix.

The PCB/MCM modeler module 201 generates a PCB/MCM analog circuit model to symbolically represent the analog characteristics of the physical layout of the PCB/MCM design. In a preferred embodiment, the PCB/MCM analog circuit model is a SPICE netlist. The source chip modeler module 203 generates a source chip analog circuit model to symbolically represent the analog characteristics of the physical layout of the source chip design. In a preferred embodiment, the source chip analog circuit model is a SPICE netlist. The target chip modeler module 205 generates a plurality of target chip behavioral circuit models to symbolically represent the behavioral characteristics of the electrical and functional specifications of each of the plurality of target chips. In a preferred embodiment, the behavioral circuit models are analog high-level description language (AHDL) models.

The integrator preprocessor module 213, coupled to the PCB/MCM modeler module 201 and the source chip modeler module 203, assembles the PCB/MCM analog circuit model and the source chip analog circuit model into a hybrid circuit model framework. In a preferred embodiment the hybrid circuit framework is a SPICE netlist.

The integrator module 219, coupled to the integrator preprocessor module 213 and the target chip modeler module 205, constructs a hybrid circuit model by integrating the target chip behavioral circuit model into the hybrid circuit model framework. The simulator module 223, coupled to the integrator module 219, provides user-defined input stimuli to the hybrid circuit model and generates analog and digital output results. The analyzer module 239 summarizes the minimum and maximum timing delays from the source chip to the target chip. The timing processor module 225 coupled to the analyzer module 239, generates standard delay format (SDF) files, which contain source chip and target chip delay timing information. The waveform processor module 227, coupled to the simulator, transforms the output results from the simulator module 223 into individual noise waveform signals for each critical signal within the hybrid circuit model.

If the timing effects and noise effects are not within a predefined range, which represents the optimum design for the source chip, the source chip design will be altered, a new hybrid circuit model will be constructed and a new simulation for generating new timing and noise effects will be executed. The HCM simulator 150 can perform numerous iterations of redesigning and reanalyzing the source chip design until the timing effects and noise effects are within the intended range of values. In a preferred embodiment, the redesigning of the source chip is manually performed by the chip designer.

Figure 3:
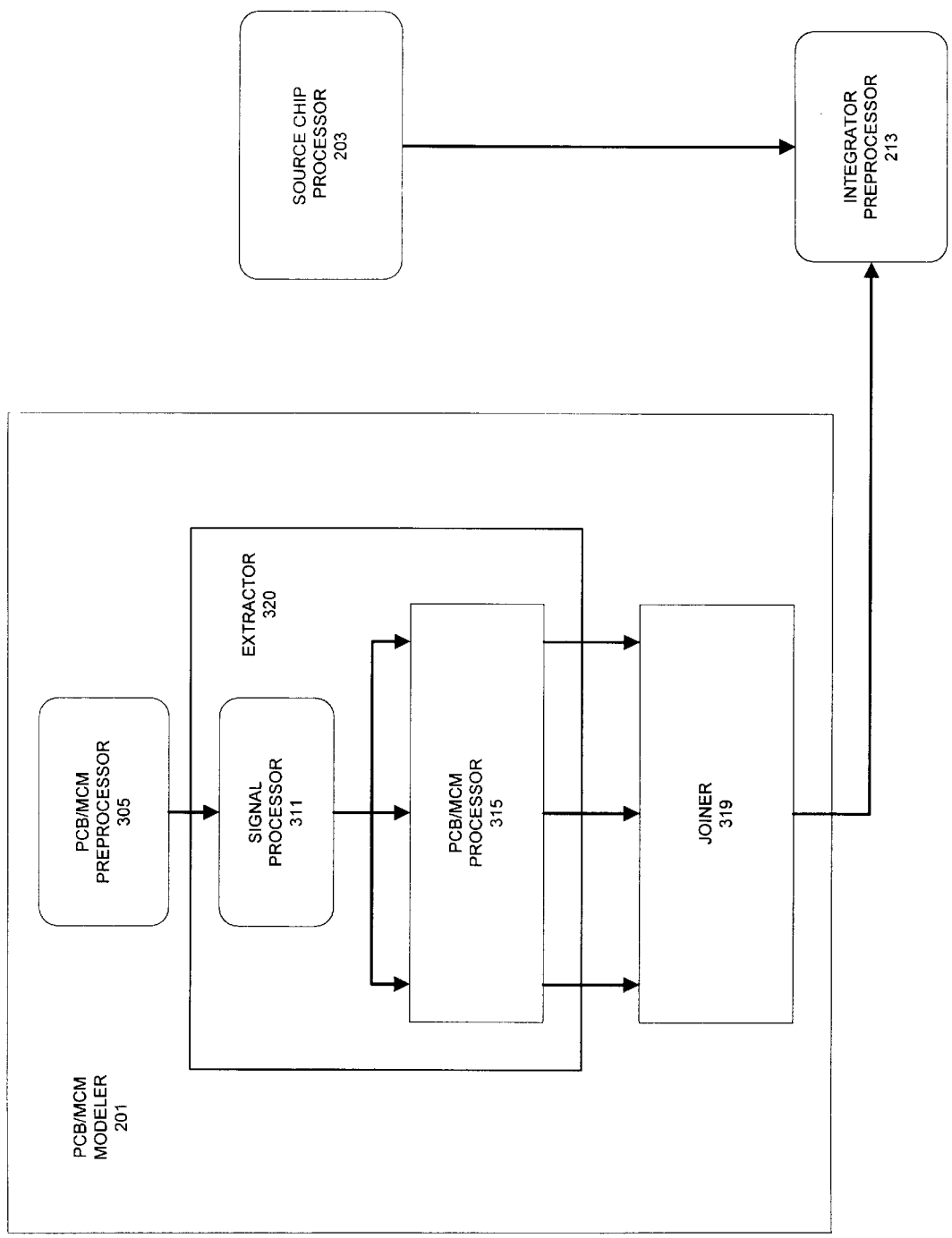
FIG. 3 is an illustration of the PCB/MCM modeler module of FIG. 2 in accordance with a preferred embodiment.

FIG. 3 is a more detailed view of the PCB/MCM modeler module 201 of FIG. 2. In particular, the PCB/MCM modeler module 201 includes a PCB/MCM preprocessor module 305, an extractor module 320 and a joiner module 319. From PCB/MCM interconnect information and a PCB/MCM trace symbol library, the PCB/MCM preprocessor module 305 creates a physical layout schematic of the PCB/MCM. In a preferred embodiment, the PCB/MCM preprocessor module 305 is part of a commercial software package such as Unisolve by Unicad of Ontario, Canada.

The extractor module 320, coupled to the PCB/MCM preprocessor module 305, includes a signal processor module 311 and a PCB/MCM processor module 315. Since the PCB/MCM physical layout schematic usually contains over the maximum number of transistors that the PCB/MCM processor 315 can process at any one time, the signal processor 311 deconstructs the PCB/MCM physical layout schematic into a plurality of subgroups of PCB/MCM transmission line signals. Once the size of the number of transistors is reduced to a manageable level, the PCB/MCM processor 315 then extracts a parasitic SPICE netlist from each of the plurality of sub-groups of PCB/MCM transmission line signals to create corresponding PCB/MCM analog circuit sub-models. In a preferred embodiment, the extractor module 320 is a software modeling tool such as Unisolve by Unicad of Ontario, Canada, which generates raw extraction files that represent the PCB/MCM analog circuit sub-models for the PCB/MCM.

Once the plurality of PCB/MCM analog circuit sub-models are constructed, a joiner module 319 combines the plurality of PCB/MCM analog circuit sub-models to create a composite PCB/MCM analog circuit model. In a preferred embodiment of the present invention, the joiner module 319 is two PERL software scripts executed in the UNIX operating system. OBATunicadjoin is a PERL script, which is used to join all of the separate files from the extraction process. OBATpcb is a PERL script that rearranges the file for the integrator preprocessor 213. Both of these scripts are attached to the appendix. As was previously discussed with regard to conventional systems, by deconstructing a circuit model, inaccuracies in the simulation of the circuit model occur. In a preferred embodiment, however, since the PCB/MCM is the only aspect of the circuit model, which is deconstructed, and the PCB/MCM is the least complex aspect of the hybrid circuit model, the errors, which are introduced by the deconstruction and reconstruction of the PCB/MCM circuit model results in only slight inaccuracies in the final results generated by simulating the hybrid circuit model.

Figure 4:
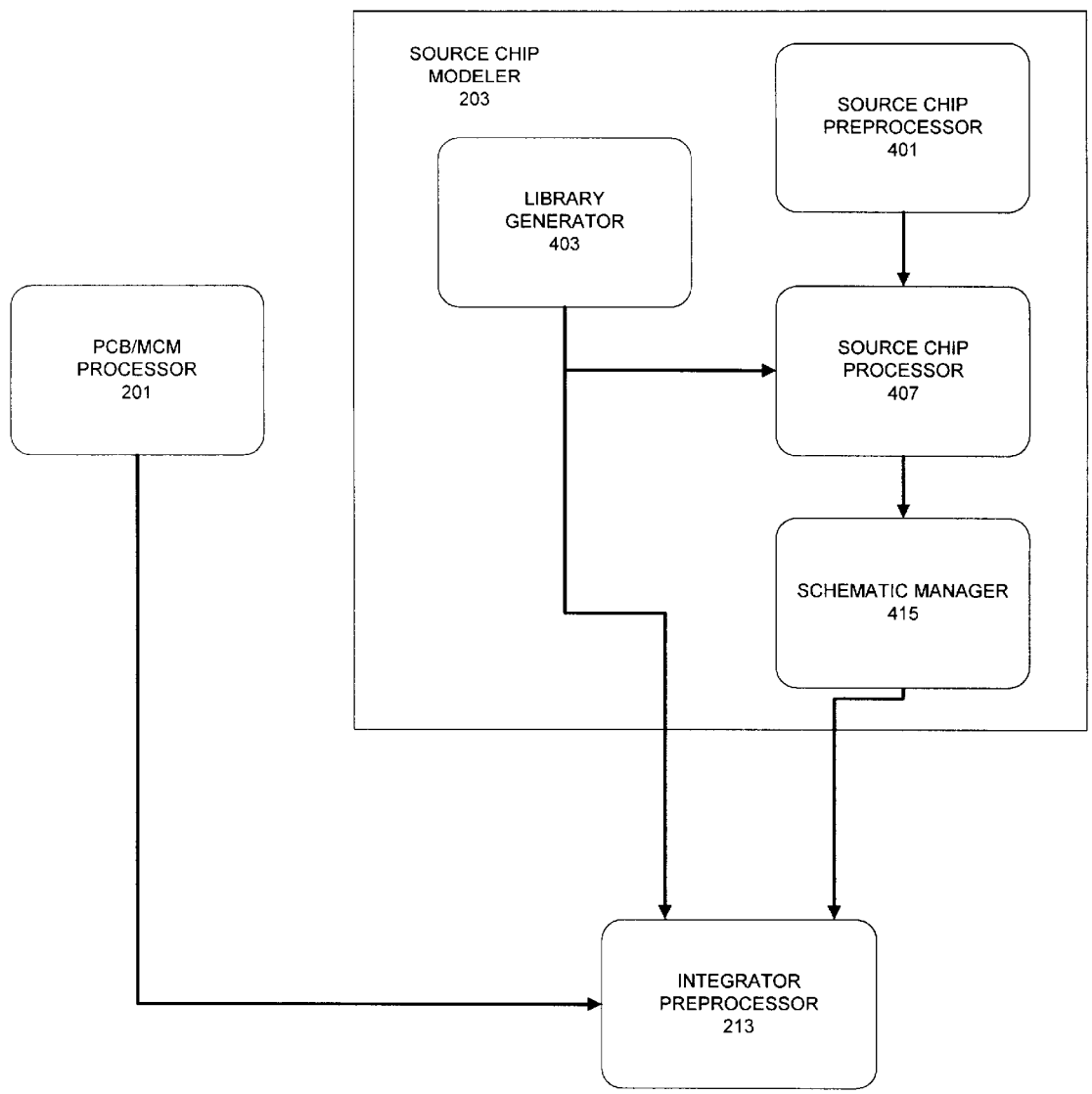
FIG. 4 is an illustration of the source chip modeler of FIG. 2 in accordance with a preferred embodiment.

Referring now to FIG. 4, the source chip modeler module 203 includes a source chip preprocessor 401, a library generator 403, a source chip processor 407 and a schematic manager 415. The source chip preprocessor 401 receives a pin location table, which provides the I/O circuit placement information for the source chip, parasitic information of the package and configured I/O data for specific functions. In a preferred embodiment, the parasitic information of the package is generated from an electronic package drawing by a commercial software package such as TurboPackage by Pacific Numberix of Scottsdale, Ariz. The source chip preprocessor 401 uses the pin location table to construct a uniform format for the table, which reflects the aspects of the schematic relating to the source chip I/O ring. In a preferred embodiment, this procedure is executed in the UNIX operating system by a software PERL script entitled OBATplt, which has been attached to the appendix. The parasitic package parameter table is transformed by the source chip preprocessor 401 into a package parameter table file, which reflects the aspects of the schematic relating to the bonding wires and package parasites associated with each pin. In a preferred embodiment, this procedure is executed in the UNIX operating system by a software PERL script entitled OBATpnc2pak, which has been attached to the appendix. The I/O data is configured to reflect the function of each I/O cell. In a preferred embodiment, this procedure is executed in the UNIX operating system by a software PERL script entitled OBATio, which has been attached to the appendix.

By simplifying a plurality of circuit blocks for the source chip I/O schematic with identifiers, the source chip preprocessor 401 is able to reduce the size of the final source chip analog circuit model without having to deconstruct the model, thereby ensuring the highest efficiency and the most accurate timing and noise effects in the hybrid circuit model simulation. In particular, the source chip preprocessor 401 identifies and replaces a plurality of I/O cell sub-circuits in the source chip I/O schematic with subcircuit library identifiers. The source chip preprocessor 401 also modifies the cell parameters directly from the schematic to set up default parameters for simulation purposes. Lastly, the source chip preprocessor 401 configures the source chip I/O functions, such as the input, output or tri-state characteristics, through modifying simple configuration files.

The library generator 403, which is coupled to the source chip preprocessor 401 and the integrator preprocessor module 213, receives a flat SPICE compatible netlist, which reflects the transistor level of the I/O design, and performs cell library characterization upon the I/O cell subcircuits to create a source chip sub-circuit library with each I/O cell sub-circuit associated with a sub-circuit library identifier. In a preferred embodiment, the library generator 403 is comprised of a PERL script executed by the UNIX operating system, entitled OBATlib, which is attached to the appendix.

After both the source chip sub-circuit library and the source chip I/O schematic are generated, the source chip processor 407 generates a source chip analog circuit model from the source chip I/O schematic by extracting a SPICE netlist. In a preferred embodiment, the source chip modeling processor 407 is a PERL software script executed by UNIX, entitled OBATsch and OBATconfigure, which are attached to the appendix. To graphically present the source chip analog circuit model for possible manual alterations by the chip designer, a schematic manager module 415 receives and displays a graphical representation of the source chip analog circuit model. In a preferred embodiment, the schematic manager module 415 is a commercial software package such as Powerview by Viewlogic System Inc. of Marlborough, Mass.

Once the source chip analog circuit model is finalized, the integrator preprocessor module 213, which is coupled to the PCB/MCM processor 201 and the source chip processor 203, integrates the source chip analog circuit model with the PCB/MCM analog circuit model by utilizing the source chip sub-circuit library and pin names. The final composite analog circuit (hybrid circuit model framework) is a netlist. In a preferred embodiment, the integrator preprocessor module 213 is a commercial software package such as WSPICE by Viewlogic Systems, Inc. of Marlborough, Mass.

Figure 5:
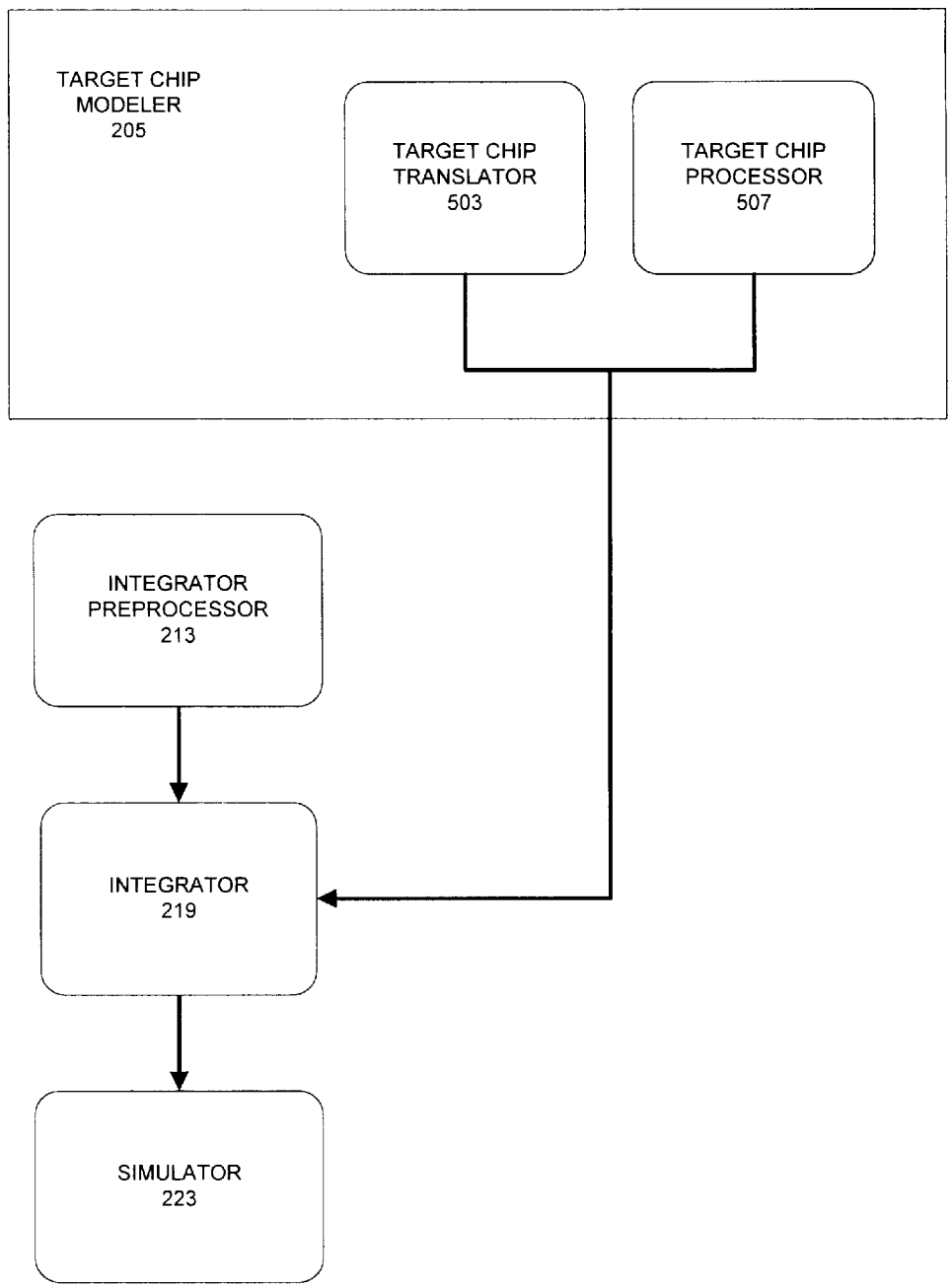
FIG. 5 is an illustration of the target chip modeler module of FIG. 2 in accordance with a preferred embodiment.

Referring now to FIG. 5, the target chip modeler module 205 includes a target chip translator module 503 and a target chip processor module 507. As previously discussed, if the vendor is unable to provide the completed target chip designs because the target chips are being designed at the same time as the source chip, behavioral models are used. In the conventional system, the use of behavioral models were problematic because IBIS behavioral models were incompatible with analog circuit models, thereby precluding the generation of an integrated hybrid circuit model. Without the integrated hybrid circuit model, the convention system experienced inherent inaccuracies due to having to interpolate how the IBIS behavioral models interacted with the analog circuit models. In a preferred embodiment, by utilizing electrical and functional target chip information to generate an analog high-level description language (AHDL) behavioral circuit model, which is compatible with analog (SPICE-based) circuit models, more accurate results are achieved because the behavioral circuit model can be integrated into the hybrid circuit model. AHDL is a high-level description language, which encapsulates high-level behavioral descriptions of integrated circuits without requiring knowledge of the low-level circuit schematic of the integrated circuit. In particular, AHDL is a functional description text file, which mathematically describes the input and output terminal behavior of the electrical circuits in terms of the connections, the parameters and the relationships between the integrated circuits.

If only an IBIS model of the target chip is available, the target chip translator 503, which is coupled to the integrator module 219, will convert the target chip behavioral model from the IBIS format to the AHDL format. In a preferred embodiment, the target chip translator module 503 and the target chip processor module 507 are part of the same PERL software script executed by UNIX, entitled obat4.mod, which is included in the appendix.

The integrator module 219, which is coupled to both the target chip modeler module 205 and the integrator preprocessor module 213, constructs the hybrid circuit model by integrating each of the target chip behavioral circuit models with the hybrid circuit model framework and then converting this composite netlist into a worst case and a best case scenario hybrid circuit model. In a preferred embodiment, the integrator module 219 is a PERL software script executed by UNIX, entitled OBATsplits, which is attached to the appendix. In addition, the hybrid circuit model is in a format, which can be simulated by a commercial software package such as Spectre by Cadence Design System of San Jose, Calif.

Referring back to FIG. 2, the simulator module 223, which is coupled to the integrator 219, receives the hybrid circuit model and integrates device models, a plurality of circuit monitoring blocks, and the highest and lowest current and voltage input levels into the hybrid circuit model. The device models define the low-level properties of each transistor within the source chip. The circuit monitoring blocks identify the specific routes to be monitored between pins on the source chip and pins on the target chips. From this information, the simulator module 223 generates real-time output results for the hybrid circuit model, which include timing effects and noise effects. In a preferred embodiment, the simulator module 223 is another functional aspect of a software simulation package such as Spectre manufactured by Cadence Design System of San Jose, Calif.

The analyzer module 239, which is coupled to the simulator module 223, receives the output results for the best and worst case scenarios of the hybrid circuit model simulations and summarizes the minimum and maximum timing delays from the source chip to the target chips. In a preferred embodiment, the output results can be converted into HTML format and viewed on a web browser such as Netscape Communicator by Netscape Communication Corporation of Mountain View, Calif. by utilizing a PERL script, executed by UNIX, entitled OBATsim2html, which is attached to the appendix.

The analyzer module 239 also will check if certain pre-defined requirements are met. Should the output results not fall within these predefined values, the source chip design is altered and a new simulation of the new hybrid circuit design is performed. By proceeding through possibly several iterations of redesigning the source chip design and simulating the operation of the new source chip design in conjunction with the PCB/MCM design and the target chip designs, an optimal design for the source chip can be better achieved. In a preferred embodiment, the analyzer module 239 is a PERL executed by UNIX, entitled OBATsummary, which is attached to the appendix.

The timing processor module 225, which is coupled to the analyzer module 239, converts the timing effects into a standard delay format (SDF) file, which contains source chip to target chip delay timing information. This timing information is embedded into logic behavior models (VHDL) for accurate system level verifications by a VHDL logic simulator (not shown). For example, the VHDL logic simulator utilizes this timing information to generate a board-level logic simulation. Since the timing information from the source chip to the target chip is embedded in the library, no estimations of the loading of the signals on the PCB/MCM are needed in order to successfully perform such board-level simulations. In a preferred embodiment, the timing processor module 225 is a PERL script executed by UNIX, entitled OBATsdf_wln, which is attached to the appendix.

The waveform processor module 227, which is coupled to the simulator 223, formats the noise effects results into individual files, which reflect each critical signal. These individual files then are generated into waveform plots. In a preferred embodiment, the waveform processor module 227 is two PERL script executed by UNIX, entitled OBATtran2dats and OBATprints, which are attached to the appendix.

Having described the present invention with reference to a specific embodiment, the above description is not meant to limit the scope of the invention. For example, the PCB/MCM design or the target chip designs, rather than the source chip design, can be the sole or joint focus of the simulations and the subsequent design iterations. Furthermore, as previously discussed, the scope of the invention is to be limited only by the following claims. From the above discussion, many variations will be apparent to one skilled in the art that would yet be encompassed by the true spirit and scope of the present invention.

What is claimed is:

1. A method for simulating the operation of a plurality of circuit models, the method comprising the steps of:
   generating a first analog circuit model which represents the analog characteristics of the physical layout of a printed circuit board;
   generating a second analog circuit model which represents the analog characteristics of the physical layout of a source chip design;
   generating an analog behavioral model which represents the functional behavioral characteristics of a target chip;
   combining the first analog circuit model with the second analog circuit model to generate a hybrid circuit model framework;
   integrating the analog behavioral model into the hybrid circuit model framework to generate a hybrid circuit model; and
   providing user defined input stimuli to the hybrid circuit model in order to simulate real time operating conditions and generate a first output signal.

2. The method of claim 1 further comprising the step of dividing the first output signal into a second output signal and a third output signal.

3. The method of claim 2 further comprising the step of transforming the second output signal into timing effect data relating to the hybrid circuit model.

4. The method of claim 2 further comprising the step of transforming the third output signal into noise effect data relating to the hybrid circuit model.

5. The method of claim 1 wherein generating the second analog circuit model which represents the analog characteristics of the physical layout of a source chip design, further comprises the additional steps of:
   generating a source chip I/O schematic;
   identifying a plurality of I/O cell subcircuits in the source chip I/O schematic and associating each I/O cell subcircuit with a subcircuit identifier;
   characterizing each I/O cell subcircuit; and
   utilizing parasitic package information and configured I/O data to generate the second analog circuit model.

6. The method of claim 1 wherein the generating of the analog behavioral model comprises the additional steps of:
   receiving an original behavioral circuit model described in a first format;
   converting the original behavioral circuit model from the first format into the behavioral model which is described in a second format.

7. The method of claim 6, wherein the first format is an Input/Output Buffer Information Specification (IBIS) based format and the second format is an analog high level description language based format.

8. A computer based system for simulating timing and noise effects in a hybrid circuit model based upon predefined electrical parameters, the system comprising:
   a storage device including functional component information of a target chip and analog characteristics of a physical layout of a printed circuit board in which the target chip is utilized and predefined electrical parameters; and
   a hybrid circuit model simulation system, coupled to the storage device, adapted to receive both the functional component information of the target chip and the analog characteristics of the physical layout of a printed circuit board in which the target chip is utilized, said hybrid circuit model simulation system being designed to integrate the functional component information of the target chip with the analog characteristics of the physical layout of the printed circuit board in order to simulate the timing effects and the noise effects of the hybrid circuit model.

9. A hybrid circuit model simulator comprising:
   a first modeler module adapted to generate a first analog circuit model from a first circuit data, said first analog circuit model including analog characteristics of a physical layout of a printed circuit board in which a target chip is to be utilized;
   a second modeler module adapted to generate a second analog circuit model from a second circuit data, said second analog circuit model including analog characteristics of the physical layout and operational characteristics of a source chip located on the printed circuit board and to which the target chip is coupled;
   a third modeler module adapted to generate an analog behavioral model from a third circuit data, said analog behavioral model including functional and operational characteristics of the target chip;
   an integrator preprocessor module, coupled to the first modeler module and the second modeler module, adapted to combine the first analog circuit model with the second analog circuit model in order to generate a hybrid circuit model framework;
   an integrator module, coupled to the integrator preprocessor module, adapted to combine the hybrid circuit model framework and the analog behavioral model of the target chip, thereby forming a hybrid circuit model; and
   a simulator module, coupled to the integrator module, adapted to apply a first input signal to the hybrid circuit model and to generate a first output signal, wherein the first output signal represents a simulated result of the operation of the hybrid circuit model.

10. The simulator of claim 9 wherein the first output signal includes timing effect data relating to the hybrid circuit model.

11. The simulator of claim 9 wherein the first output signal includes noise effect data relating to the hybrid circuit model.

12. The simulator of claim 9 wherein the first modeler includes:
   a printed circuit board preprocessor which receives interconnect information and trace symbols and creates a physical layout schematic of the printed circuit board;
   an extractor module adapted to segregate the physical layout schematic of the printed circuit board into a plurality of analog circuit sub-models, each sub-model containing a subset of the total number of interconnect and trace symbols; and
   a joiner module, coupled to the extractor module, adapted to combine the plurality of fourth analog circuit models into the first analog circuit model.

13. The simulator of claim 9 wherein the analog characteristics of the physical layout of the source chip comprises a package parameter table and a pin location table.

14. The simulator of claim 9 wherein the third modeler module includes a translator, coupled to the integrator module, adapted to convert the analog behavioral model from a first format to a second format.

15. The simulator of claim 9 wherein the third circuit data comprises electrical and functional circuit information.

16. The simulator of claim 9 wherein the analog behavioral model includes an analog high-level description language model.

17. The simulator of claim 9 wherein the second modeler module includes a schematic manager module adapted to graphically edit the second analog circuit model.

* * * * *